(12) United States Patent
Holbrook et al.

(10) Patent No.: US 6,495,853 B1
(45) Date of Patent: Dec. 17, 2002

(54) SELF-ALIGNED GATE SEMICONDUCTOR

(75) Inventors: Allison Holbrook, San Jose, CA (US); Jiahua Huang, San Jose, CA (US); Sunny Cherian, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/636,333

(22) Filed: Aug. 10, 2000

(51) Int. Cl.⁷ .............................................. H01L 29/06
(52) U.S. Cl. .................... 257/30; 257/314; 257/315; 257/318; 257/321
(58) Field of Search .................... 257/30, 314, 315, 257/321

(56) References Cited

U.S. PATENT DOCUMENTS

| | | | | |
|---|---|---|---|---|
| 6,087,696 A | * | 7/2000 | Li et al. | 257/321 |
| 6,093,606 A | * | 7/2000 | Liu et al. | 438/259 |
| 6,118,147 A | * | 9/2000 | Liu | 257/315 |
| 6,177,317 B1 | * | 1/2001 | Huang et al. | 438/263 |
| 6,232,635 B1 | * | 5/2001 | Wang et al. | 257/318 |
| 6,255,689 B1 | * | 7/2001 | Lee | 257/314 |

* cited by examiner

Primary Examiner—David Nelms
Assistant Examiner—Thao P Le
(74) Attorney, Agent, or Firm—Mikio Ishimaru

(57) ABSTRACT

A method of manufacturing a semiconductor device is provided in which a tunnel dielectric layer and a gate layer are formed on a semiconductor wafer and a trench forming technique is used to define a floating gate structure. An insulator is deposited in the trench whereby the gate layer and the tunnel dielectric layer form a gate which is self-aligned to a tunnel dielectric.

10 Claims, 5 Drawing Sheets

SELF-ALIGNED GATE SEMICONDUCTOR

TECHNICAL FIELD

The present invention relates generally to semiconductors and more specifically to a trench fabrication process for making semiconductor memory devices.

BACKGROUND ART

Flash electrically erasable programmable read only memory (EEPROM) is a class of nonvolatile memory devices that are programmed by hot electron injection and erased by Fowler-Nordheim tunneling.

Each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The multi-layer stacked gate structure typically includes: a thin gate dielectric or tunnel oxide layer formed on the surface of substrate overlying the channel region; a polysilicon floating gate (poly1) overlying the tunnel oxide; an interpoly dielectric layer overlying the floating gate; and a polysilicon control gate (poly2) overlying the interpoly dielectric layer. Additional layers, such as a silicide layer (deposited on the control gate), a poly cap layer (deposited on the gate silicide layer), and a silicon oxynitride layer (deposited on the poly cap layer) may be formed over the control gate.

In order to have the memory cell work properly, the stacked gate structure must have every layer properly aligned within nanometers of the previous layer. The worse the alignment, the worse the device performance will be. As the device shrinks, these nanometer shifts become a significant problem in that the memory cell will not operate.

A plurality of Flash EEPROM cells may be formed on a single substrate. A Flash EEPROM also includes peripheral portions, which typically include input/output circuitry for selectively addressing individual memory cells.

After the formation of the memory cells, electrical connections, commonly known as "contacts", must be made to connect the stack gated structure, the source region and the drain regions to other parts of the chip. The contact formation process includes the formation of sidewall spacers around the multi-layer stacked gate structures of each memory cell and a silicidation on the active region. An etch stop or liner layer, typically a nitride material such as silicon nitride, is then formed over the entire substrate, including the multi-layer stacked gate structure. A dielectric layer, generally of oxide such as borophosphosilicate glass (BPSG), is then deposited over the etch stop layer. A chemical-mechanical planarization (CMP) process is applied to the wafer and wafer-scale planarization is achieved. A layer of photoresist is then placed over the dielectric layer and is photolithographically processed to form the pattern of contact openings. An anisotropic etch is then used to etch out portions of the dielectric layer to form source and drain contact openings in the oxide layer. The contact openings stop at the source and drain regions in the substrate. The photoresist is then stripped, and a conductive material, such as tungsten, is deposited over the dielectric layer and fills the source and drain contact openings to form conductive contacts. The substrate is then subjected to a CMP process, which removes the conductive material above the dielectric layer to form the conductive contacts through a contact CMP process.

As can be seen from the above, precise placement and layering of the multi-layer stacked gate structure is imperative for future size reductions of memory devices.

A solution, which would allow further miniaturization of memory device without adversely affecting device performance has long been sought, but has eluded those skilled in the art. As the demand for higher performance devices and miniaturization continues at a rapid pace in the field of semiconductor, it is becoming more pressing that a solution be found.

DISCLOSURE OF THE INVENTION

The present invention provides a tunnel dielectric layer and a gate layer formed on a semiconductor wafer with a trench insulator of a shallow trench isolation (STI) used to form a floating gate structure which is self-aligned to the active region. The semiconductor device has improved floating gate properties and improved planarity when compared to conventional semiconductor devices.

The present invention further provides a method of manufacturing a self-aligned floating gate structure by forming a tunnel dielectric layer and a gate layer on a semiconductor wafer. A trench forming technique is used to form a shallow trenchl through the tunnel dielectric layer, the gate layer and into the semiconductor wafer. An insulator is deposited in the trench whereby the semiconductor device has improved floating gate properties and improved planarity when compared to conventional semiconductor devices.

The present invention further provides a method of manufacturing a floating gate structure which involves a reduction in the number of processing steps when compared to conventional fabrication techniques.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
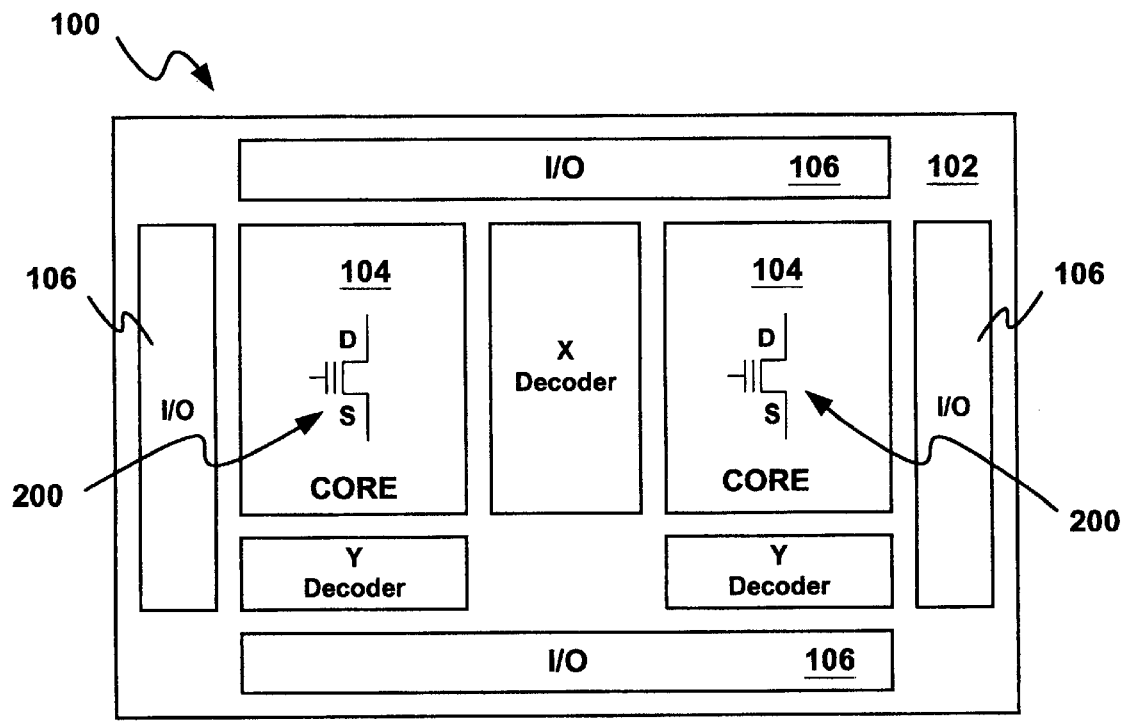
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a semiconductor substrate 102 in which one or more high-density core regions and one or more low-density peripheral portions are formed. High-density core regions typically include one or more M×N array cores 104 of individually addressable, substantially identical memory cells 200. Low-density peripheral portions 106 typically include input/output (I/O) circuitry and circuitry for selectively addressing the individual cells. The selective addressing circuitry typically includes one or more x-decoders and y-decoders, cooperating with the I/O circuitry for connecting the source, gate, and drain of selected addressed cells to predetermined voltages or impedances to effect designated operations on the cell, e.g., programming, reading and erasing, and deriving necessary voltages to effect such operations.

Figure 2A:
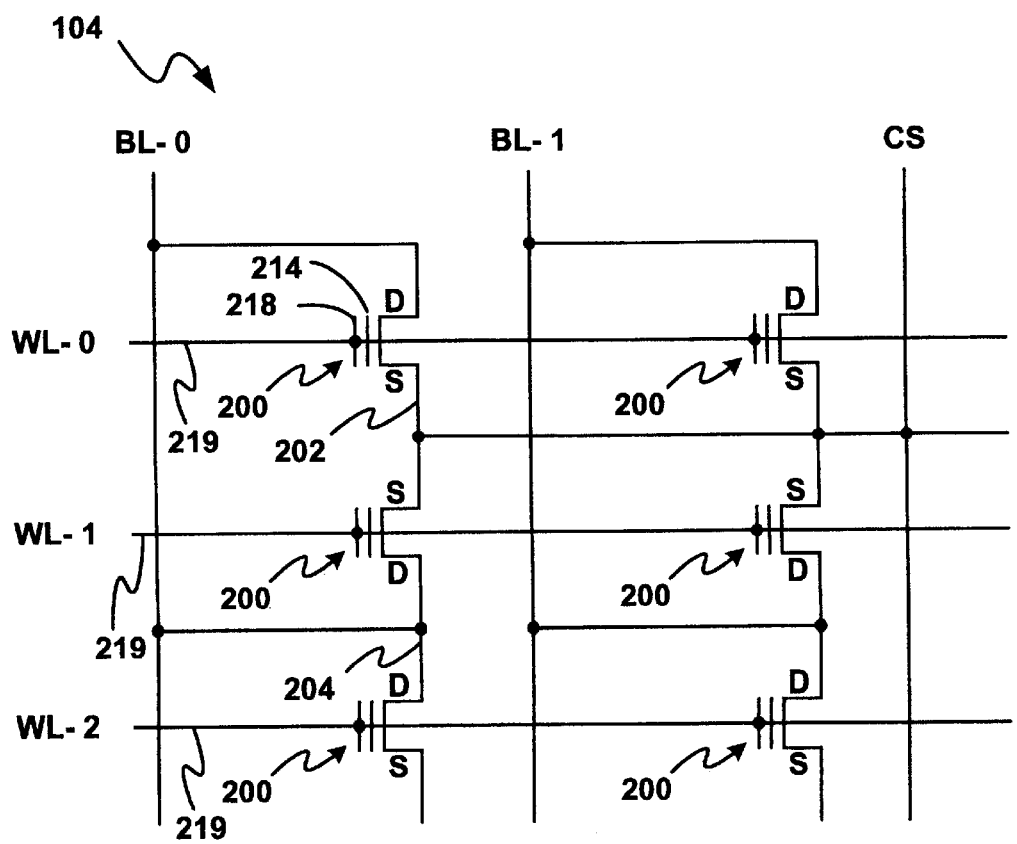
FIG. 2A (PRIOR ART) is schematic diagram of a portion of a memory cell array.
Figure 2B:
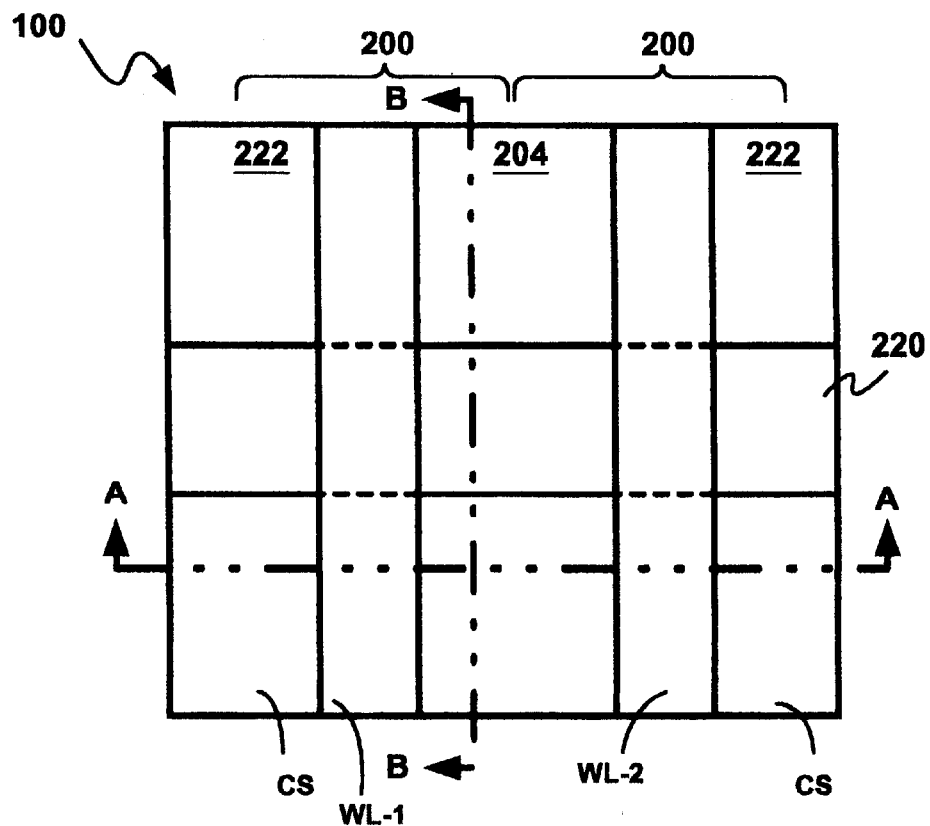
FIG. 2B (PRIOR ART) is a plan view of a portion of an intermediate state (partially complete) of a cell array core.
Figure 2C:
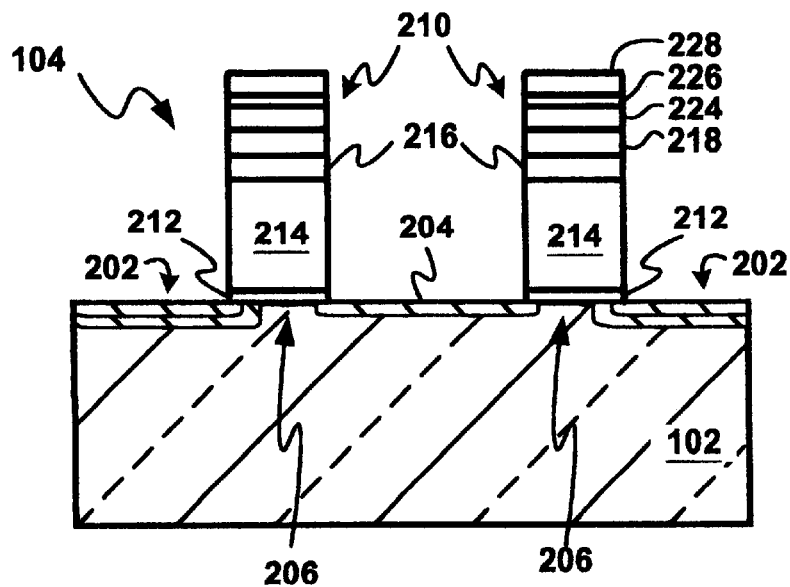
FIG. 2C (PRIOR ART) is a simplified cross section of FIG. 2B (PRIOR ART) along line A—A.

Referring now to FIG. 2A (PRIOR ART), therein is shown a schematic diagram of a portion of a memory cell array in which each cell in array core 104 typically comprises a source 202, a drain 204, and a channel 206 (shown in FIG. 2C (PRIOR ART)).

Referring now to FIG. 2B (PRIOR ART), therein is shown a plan view of a portion of an intermediate state (partially complete) of a cell array core 104.

Referring now to FIG. 2C (PRIOR ART), therein is shown a simplified cross section of FIG. 2B (PRIOR ART) along line A—A. The source 202, drain 204, and channel 206 semiconductor regions are shown formed in semiconductor substrate 102 (or in an isolation well); and a multi-layer structure, commonly referred to as a "stacked gate" (word line) structure 210. The stacked gate structures 210 include: thin gate dielectric layer 212 (commonly referred to as the "tunnel oxide") formed on the surface of the semiconductor substrate 102 overlying a channel 206; a floating gate 214 overlying the thin gate dielectric layer 212; an interpoly (inter-gate) dielectric 216 overlying the floating gate 214; and a control gate 218 overlying the interpoly dielectric 216. Additional layers, such as a silicide layer 224 (disposed on the control gate 218), a poly cap layer 226 (disposed on the silicide layer 224), and a silicon oxynitride layer 228 (disposed on the poly cap layer 226) may be formed over the control gate 218. The memory cells 200 are arranged in a series of horizontal rows and columns.

The term "horizontal" as used herein is defined as a plane parallel to the conventional plane or surface of the semiconductor substrate 102 regardless of its orientation. The term "vertical" refers to a direction perpendicular to the horizontal as just defined. Terms, such as "on", "above", "below", "over", "under", and "upper" are defined with respect to the horizontal plane.

In the completed array, the control gates 218 of the memory cells 200 in a row are formed integral to a common word line (WL) 219 associated with the row, such as WL-0, WL-1, and WL-2.

Columns of cells are arranged such that adjacent cells in a column share a common semiconductor region as a source or drain region. The source 202 of each cell in a column (except end cells) is formed in a common region with one of the adjacent cells, e.g., the preceding cell in the column. Likewise, the drain of the cell is formed in a common region with the drain 204 of the other adjacent cell, e.g., the next succeeding cell in the column (except end cells). The drain 204 of each cell in a column of cells is connected by a conductive bit line (BL) (FIG. 2A (PRIOR ART)), including an overlying layer of metal connected to each drain 204 of the memory cells 200 within the column. Additionally, the sources 202 of each memory cell 200 in a row (and hence pairs of rows) are interconnected by a common source line CS (FIG. 2A (PRIOR ART)) formed in the semiconductor substrate 102, as will be described. Any particular memory cell 200 within the array cores 104 can be individually addressed (programmed and read) by operating upon one word line and one bit line.

Typically, in forming an EEPROM 100, a pattern of field oxide regions 220 (FIG. 2B (PRIOR ART)) is initially formed to provide electrical isolation between the respective devices of EEPROM 100. For example, field oxide regions 220 are used to provide isolation between the array cores 104 and the devices of peripheral portions 106, as well as between the various columns of cells 200 within the array cores 104. Field oxide regions 220 are conventionally formed using a mask and selective growth process: a layer of thermal oxide ("barrier oxide" or "pad oxide") is grown or deposited over the surface of the semiconductor substrate 102; a mask, frequently composed of nitride, is deposited on the barrier oxide, and patterned to cover those regions of the semiconductor substrate 102 in which devices are to be formed (herein referred to as active regions); field oxide is grown in the exposed areas of the barrier oxide, by for example, the local oxidation of silicon (LOCOS); and the masking layer and barrier oxide are stripped to expose the underlying semiconductor substrate 102. In general, referring to FIG. 2B (PRIOR ART), within the array cores 104, the selective growth process results in alternating parallel strips of field oxide regions 220 and exposed regions corresponding to the columns of memory cells 200 in the array.

The stacked gate structures 210 are then typically formed. For example, thin gate dielectric layer 212, comprising a thin (e.g. approximately 100 Angstroms or Å) layer of oxide, is initially formed on the semiconductor substrate 102 by a technique, such as thermal oxidation of the surface of the semiconductor substrate 102 or by depositing a suitable material on the semiconductor substrate 102. A layer of conductive polysilicon (e.g., polycrystalline silicon), that will ultimately form the floating gates 214, is typically then formed on the thin gate dielectric layer 212. For example, conductive polysilicon may be deposited by a number of different techniques, e.g., conventional chemical vapor deposition (CVD). The polysilicon layer is typically then masked and etched to remove stips overlying the field oxide regions 220, leaving isolated strips of polysilicon on top of the thin gate dielectric layer 212 overlying the substrate regions corresponding to the columns of memory cells 200 of the array core 104 (i.e. the regions in which source, channel, and drain regions of cells in the column will be formed). A layer of dielectric material, such as, e.g., an oxidenitride-oxide (ONO) layer, that will ultimately form interpoly dielectric 216 is typically then formed. For example, where the interpoly dielectric 216 is ONO, it is formed by growing a layer of oxide, depositing a layer of nitride, followed by growing another layer of oxide. The interpoly dielectric 216, in the completed array, insulates control gates 218 from floating gates 214 in the individual cells and electrically isolates the adjacent columns of the floating gates 214 in the array core 104. Another layer of conductive polysilicon (e.g., polycrystalline silicon), that will ultimately form the control gates 218 and the word lines WL 219 connecting the control gates 218 of the cells in the respective rows of the array core 104, referred to as the control gate 218, is typically then deposited on the interpoly dielectric 216 by a technique such as conventional CVD. Portions of the control gate 218, the floating gate 214, and the interpoly dielectric 216 are typically then selectively removed to define the stacked gate structures 210 on the thin gate dielectric layer 212, i.e., to form the floating gates 214, the interpoly dielectric 216, control gates 218 of the individual cells, and the word lines WL (portions of the interpoly dielectric 216, the control gate 218, and the field oxide regions 220 connect the respective memory cells 200 of the rows of the array cores 104). This is typically effected by masking and etching techniques.

When completed, this etch creates the generally parallel, spaced apart, stacked gate structures 210, as shown in FIG. 2C (PRIOR ART). The silicide layer 224 is typically provided over the control gate 218 to reduce resistance. Thereafter, the polysilicon layer (commonly referred to as a "poly cap" layer) 226 is formed over the silicide layer 224 to serve as a cap layer for the stacked gate structures 210. Next, the silicon oxynitride layer 228 may be formed over the poly cap layer 226. The combination of the poly cap layer 226 and the silicon oxynitride layer 228 is commonly referred to as a "passivation layer". Thereafter, portions of the poly cap layer 226 and the silicon oxynitride layer 228 are selectively removed using conventional masking and etching techniques to define the final stacked gate structures 210.

Conventionally, the portions of the field oxide regions 220 and the thin gate dielectric layer 212 between every second pair of adjacent stacked gate structures 210 in the array core 104 (i.e., the regions, generally indicated as 222, where the sources 202 are to be formed and the portions of the field oxide regions 220 are disposed between sources 202 of the corresponding cells of adjacent columns) are then typically removed, in preparation for formation of the common line CS (not shown) connecting the sources 202. This is typically effected using a conventional Self-Aligned Source (SAS) etch.

Figure 2D:
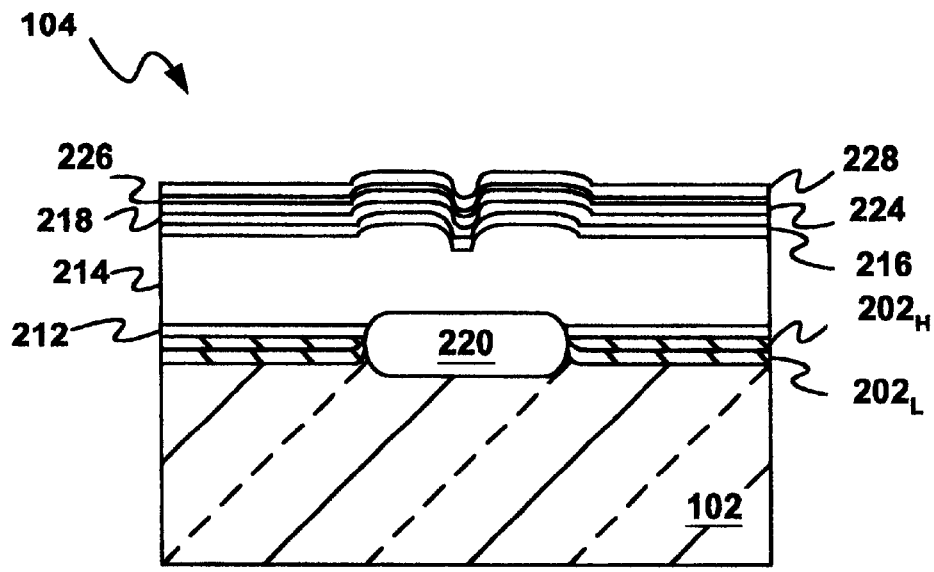
FIG. 2D (PRIOR ART) is a simplified cross section of FIG. 2B (PRIOR ART) along line B—B.

Referring now to FIG. 2D (PRIOR ART), therein are shown the source 202, common line CS, and drain 204 regions formed in a conventional process. The source 202 and the common source line CS are typically formed by initially effecting a conventional double diffusion implant (DDI), with the SAS mask still in place. The DDI implants a first dopant (e.g. n-type, such as phosphorous) to form a deeply diffused but lightly doped N well $202_L$ establishing a graded source-channel junction as shown in FIG. 2D (PRIOR ART) which is a simplified cross section of FIG. 2B (PRIOR ART) along line B—B. The SAS mask is then removed. The DDI implant is typically driven deeper into the semiconductor substrate 102, by subjecting the semiconductor substrate 102 to a thermal cycle at a high temperature (e.g. 1050° C.). A shallow second implant, commonly referred to as a medium diffused drain (MDD) implant, is then performed (e.g., with arsenic) to create a more heavily doped, but shallower, n+ well $202_H$ embedded within deep N well $202_L$. The MDD implant also forms a shallow, abrupt drain 204.

Figure 3A:
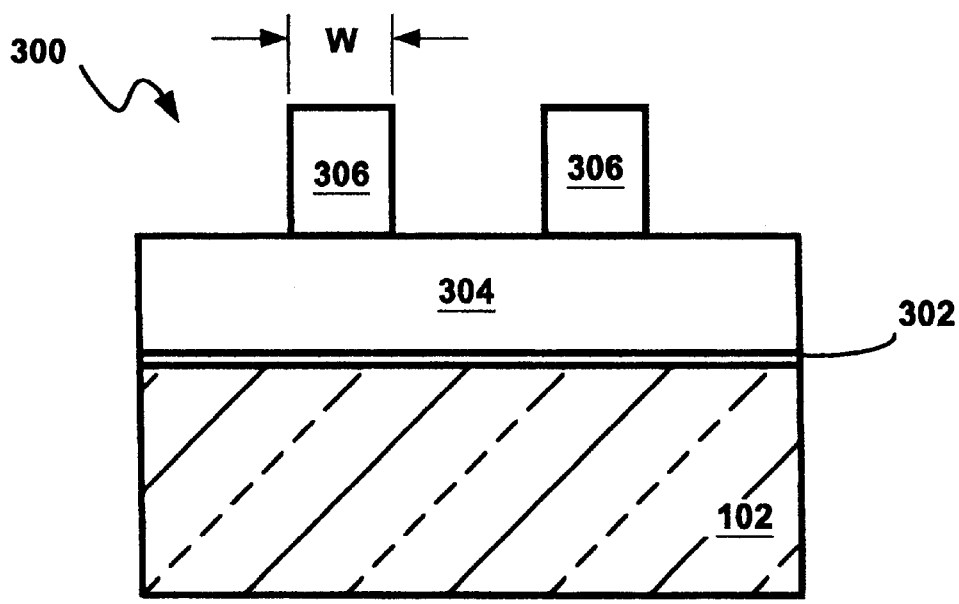
FIGS. 3A (PRIOR ART) through 3C (PRIOR ART) illustrate a simplified sequence of process steps of a conventional process for forming lines a floating gate.

Referring now to FIGS. 3A (PRIOR ART) through 3C (PRIOR ART), therein is shown a simplified sequence of process steps of a conventional process for floating gates, which are made of the polysilicon.

In FIG. 3A (PRIOR ART), therein is shown a wafer 300 having a gate dielectric layer 302 deposited on the substrate 102 (which is the same as in the prior art for ease of reference). A gate layer 304 is deposited on the gate dielectric layer 302. A photoresist has been deposited, patterned, exposed, and developed to form, on the gate layer 304, the patterned photoresist 306, which extends horizontally in a direction perpendicular to the cross-section and into the figure.

The gate dielectric layer 302 is generally of an oxide, although nitrides and other materials are coming into use as the gate dielectric, and the gate layer 304 is of conductive polysilicon (e.g. polycrystalline silicon).

Figure 3B:
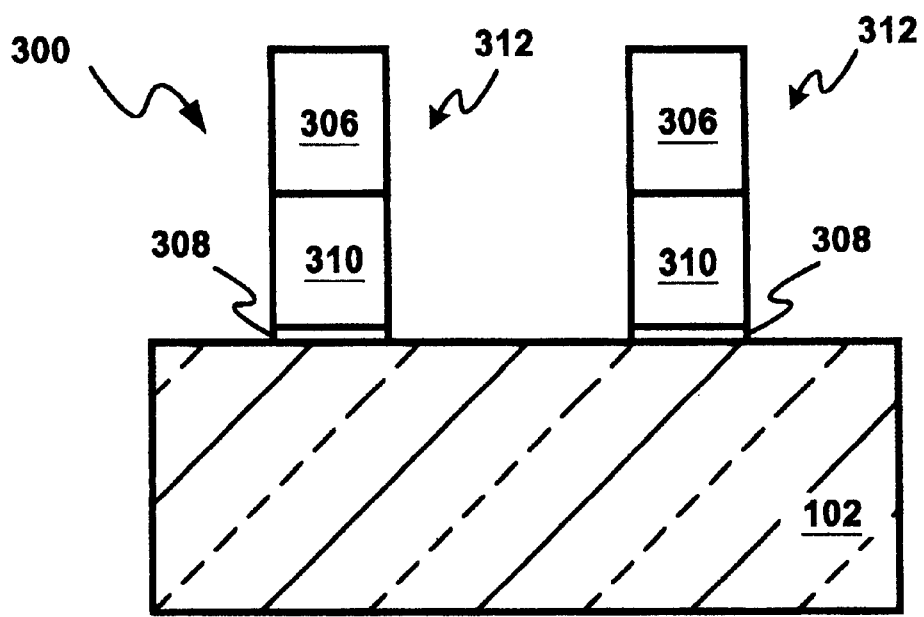

FIG. 3B (PRIOR ART) shows the structure of FIG. 3A (PRIOR ART) after etching of the gate dielectric layer 302 and the gate layer 310 using the patterned photoresist 306 as a mask.

As a result of the etching, therein is shown gate dielectric 308 under a gate 310 with sides which are vertical and in line with the patterned photoresist 306 to form a line structures 312.

Figure 3C:
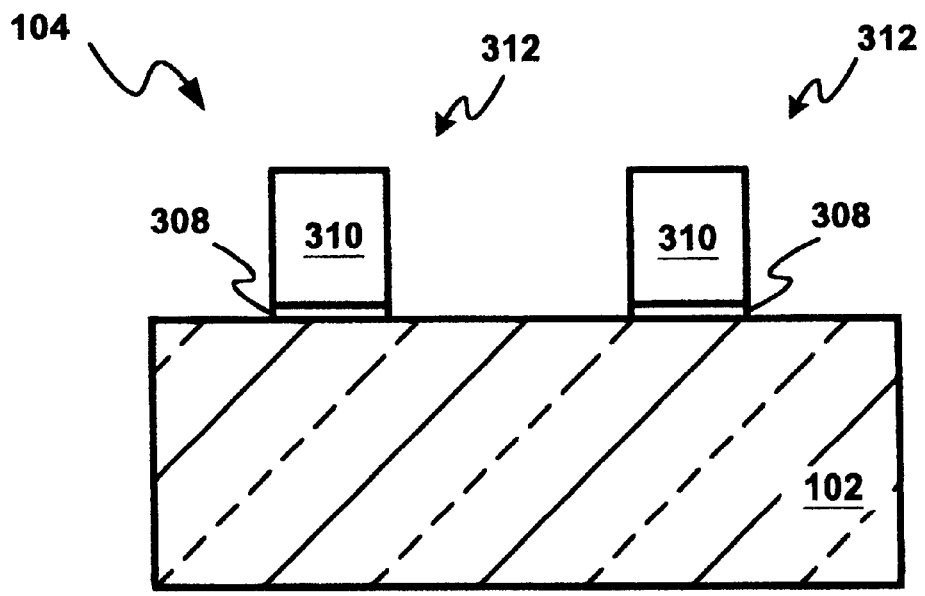

In FIG. 3C (PRIOR ART) the patterned photoresist 306 is shown removed to show the finished floating 312 in which the gates 310 have vertical sides which are formed by anisotropic plasma etching.

Referring now to FIGS. 4–7, therein is shown a simplified sequence of process steps of a process in accordance with the present invention for forming floating gates in a portion of a cell array core 104.

Figure 4:
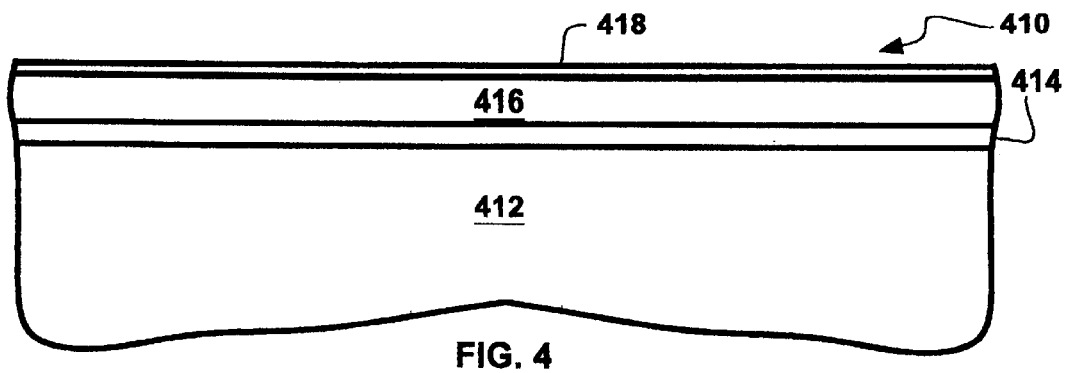
FIG. 4 is a cross-sectional view of a semiconductor wafer having a plurality of layers formed hereon in accordance with the present invention.

Referring now to FIG. 4, therein is shown a semiconductor wafer 412 having a tunnel dielectric layer 414 formed thereon. A gate layer 416 is formed on the tunnel dielectric layer 414 and a cap layer 418 is formed on the gate layer 416.

Generally, the semiconductor wafer 412 is a silicon wafer which has been doped to form source/drain regions in its upper surface. The tunnel dielectric layer 414 is of oxide, such as silicon oxide ($SiO_2$), although silicon nitride (SiN) is starting to come into use for this layer. The gate layer 416 is of polymorphous silicon (poly). The cap layer 418 is of a dielectric material, such as silicon oxynitride (SiON).

It will be understood by those skilled in the art that additional layers could be used on top of or in place of the cap layer 418, such as an interpoly dielectric layer, a polysilicon control gate, a silicide layer, a poly cap layer, and/or a further cap dielectric layer. The three layers shown are merely exemplary.

Figure 5:
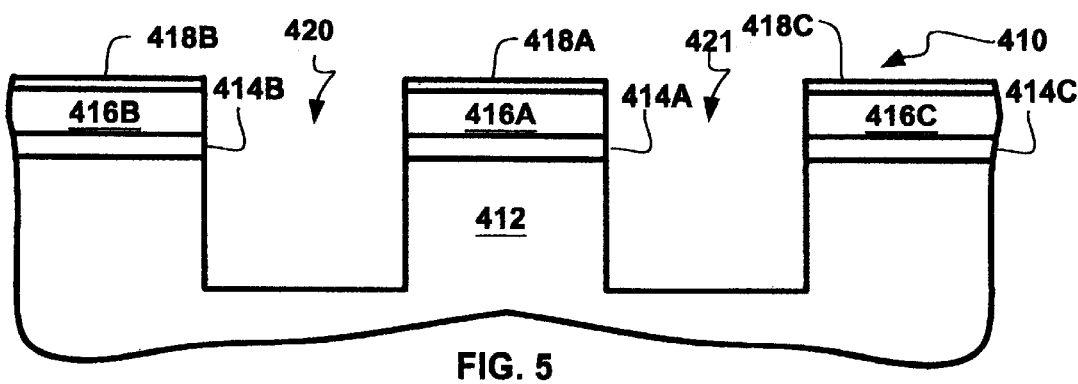
FIG 5 is the semiconductor wafer of FIG. 4 having shallow trenches formed therein in accordance with the present invention.

Referring now to FIG. 5, therein is shown the semiconductor wafer 412 after a shallow trench isolation (STI) mask (not shown) has been patterned, exposed, and developed. The STI mask is used in a number of sequential etching steps with different etches. The sequential etching process uses different etches to remove the cap layer 418, the gate layer 416, the tunnel dielectric layer 414, and a portion of the semiconductor wafer 412 to form a trench in the semiconductor wafer 412. Thus, an oxynitride, a poly, an oxide, and a silicon etch would be used sequentially with the previously named materials.

For ease of illustration, two trenches 420 and 421 are shown in FIG. 5 to either side of an incipient floating gate structure. It will be understood that the single trench used to form the self-aligned floating gate structures of the present invention could also be used in place of the conventional shallow trench isolation (STI) used to separate semiconductor devices on a semiconductor wafer.

Figure 6:
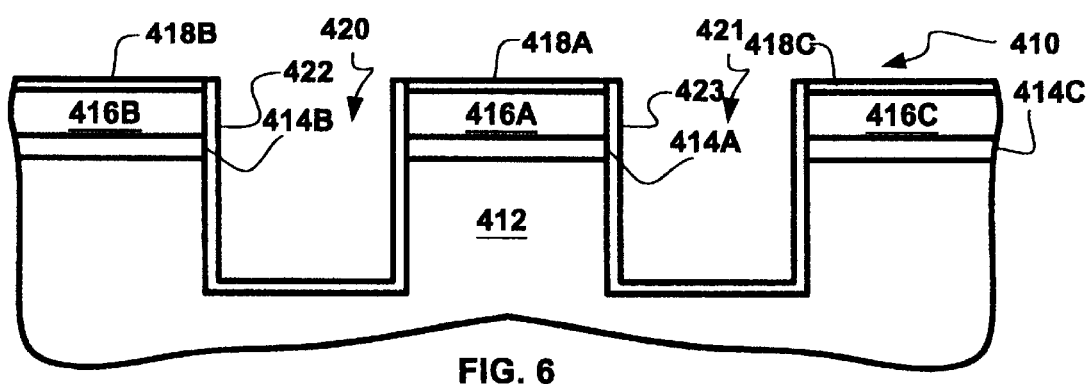
FIG. 6 is the semiconductor wafer of FIG. 5 after a liner formation in the present invention.

Referring now to FIG. 6, therein is shown the growth of an optional liner 422 in the trench 420 (FIG. 5). The liner 422 is generally a silicon oxide or nitride liner which is used for providing a conformal layer, without sharp edges, for subsequent depositions.

Figure 7:
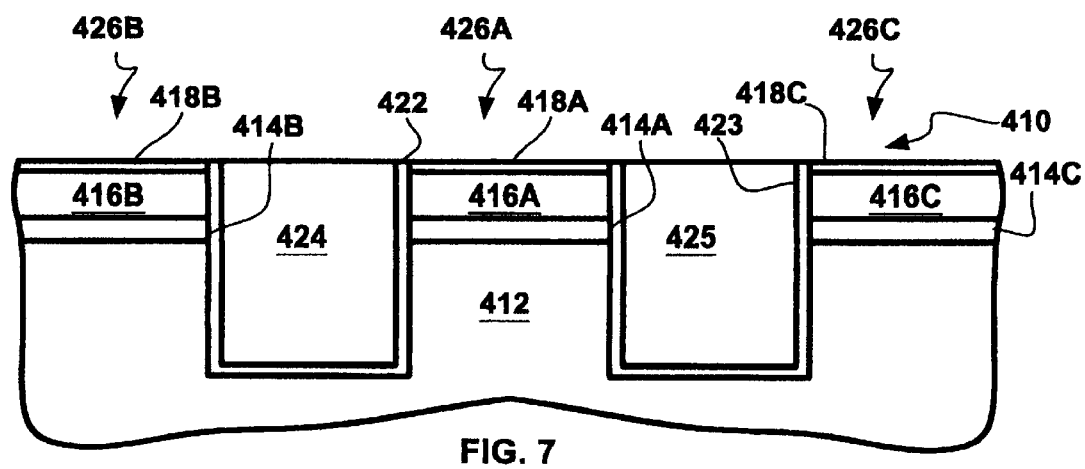
FIG. 7 is a completed self-aligned floating gate structure in accordance with the present invention.

Referring now to FIG. 7, therein is shown the semiconductor wafer 412 having filled shallow trench insulators 424 and 425 which define a completed self-aligned floating gate structure 416A. The floating gate structure 416A consists of a tunnel dielectric 414A, a gate 416A, and a cap 418A. Structures 426B and 426C could also be floating gate structures with respective tunnel dielectrics 414B and 414C, respective gates 416B1 and 416C, and respective caps 418B and 418C where additional shallow trench insulators are formed.

The shallow trench insulators 424 and 425 are formed by coating the semiconductor wafer 412 with an insulator material, such as silicon dioxide which also fills the trenches 420 and 421. The semiconductor wafer 412 is then subjected to a chemical mechanical planarization (CMP) process to form the shallow trench insulators 424 and 425 to be coplanar with caps 418A, 418B, and 418C.

After the above steps are performed in FIGS. 4–7, the semiconductor wafer 412 is ready for the conventional memory processing steps.

The above method not only provides for the proper alignment of the various layers in the multi-layer floating gate structure but also provides for a top planar surface with improved planarity for subsequent processing steps.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A semiconductor device comprising:
   a semiconductor wafer having a trench provided therein with a trench vertical side;
   a tunnel dielectric on the semiconductor wafer, the tunnel dielectric having a tunnel dielectric vertical side in vertical alignment with the trench vertical side;
   a gate on the tunnel dielectric, the gate having a gate vertical side in vertical alignment with the trench vertical side and the tunnel dielectric vertical side; and
   a trench insulator in the trench, the trench insulator having a trench insulator vertical side parallel to the trench vertical side, the tunnel dielectric vertical side, and the gate vertical side.

2. The semiconductor device as claimed in claim 1 including a liner layer in the trench and in contact with the trench vertical side, the tunnel dielectric vertical side, and the gate vertical side.

3. The semiconductor device as claimed in claim 1 including a cap on the gate, the cap having a cap vertical side in vertical alignment with the trench vertical side, the tunnel dielectric vertical side, and the gate vertical side.

4. The semiconductor device as claimed in claim 1 including a second dielectric over the gate, the second dielectric having a second dielectric vertical side in vertical alignment with the trench vertical side, the tunnel dielectric vertical side, and the gate vertical side.

5. The semiconductor device as claimed in claim 4 including a second gate over the second dielectric, the second gate having a second gate vertical side in vertical alignment with the trench vertical side, the tunnel dielectric vertical side, the gate vertical side, and the second dielectric vertical side.

6. A silicon device comprising:
   a silicon wafer having first and second trenches provided therein with respective first and second trench vertical sides;
   a tunnel oxide layer on the silicon wafer, the tunnel oxide layer having first and second tunnel oxide layer vertical sides respectively in vertical alignment with the first and second trench vertical sides;
   a polysilicon gate on the tunnel oxide layer, the polysilicon gate having first and second polysilicon gate vertical sides respectively in vertical alignment with the fist and second trench vertical sides, and respectively in vertical alignment with the first and second tunnel oxide layer vertical sides; and first and second trench oxides respectively disposed in the first and second trenches, the first and second trench oxides having respective first and second trench oxide vertical sides respectively parallel to the first and second trench vertical sides, the first and second tunnel oxide layer vertical sides, and the first and second polysilicon gate vertical sides.

7. The silicon device as claimed in claim 6 including first and second oxide lines in the first and second trenches lining the silicon wafer, the tunnel oxide layer, and the polysilicon gate.

8. The silicon device as claimed in claim 6 including a cap oxide over the polysilicon gate, the cap oxide having first and second cap oxide vertical sides in respective vertical alignment with the first and second polysilicon gate vertical sides and respectively parallel to the first and second trench vertical sides.

9. The silicon device as claimed in claim 6 including an interpoly oxide over the polysilicon gate, the interpoly oxide having first and second interpoly oxide vertical sides in respective vertical alignment with the first and second trench vertical sides, the first and second tunnel oxide layer vertical sides, and the first ad second polysilicon gate vertical sides, and respectively parallel with the fist and second trench oxide vertical sides.

10. The silicon device as claimed in claim 9 including a polysilicon control gate over the interpoly oxide, the polysilicon control gate having first and second polysilicon control gate vertical sides respectively in vertical alignment with the first and second trench vertical sides, the first and second tunnel oxide layer vertical sides, the first and second polysilicon gate vertical sides, and the first and second interpoly oxide vertical sides, and respectively parallel with the first and second trench oxide vertical sides.

\* \* \* \* \*

UNITED STATES PATENT AND TRADEMARK OFFICE
CERTIFICATE OF CORRECTION

PATENT NO. : 6,495,853 B1
DATED : December 17, 2002
INVENTOR(S) : Holbrook et al.

It is certified that error appears in the above-identified patent and that said Letters Patent is hereby corrected as shown below:

Column 2,
Line 28, delete "trench1" and insert therefore -- trench --

Column 4,
Line 47, delete "stips" and insert therefore -- strips --

Column 8,
Line 22, "fist" and insert therefore -- first --
Line 32, delete "lines" and insert therefore -- liners --
Line 47, delete "ad" and insert therefore -- and --
Line 48, delete "fist" and insert therefore -- first --

Signed and Sealed this

Thirteenth Day of May, 2003

JAMES E. ROGAN
*Director of the United States Patent and Trademark Office*